US006970684B2

(12) United States Patent
Haapakoski

(10) Patent No.: US 6,970,684 B2
(45) Date of Patent: Nov. 29, 2005

(54) METHOD FOR REDUCING INTERFERENCE IN TRANSMITTER AND TRANSMITTER

(75) Inventor: Arto Haapakoski, Äänekoski (FI)

(73) Assignee: Nokia Corporation, Espoo (FI)

( * ) Notice: Subject to any disclaimer, the term of this patent is extended or adjusted under 35 U.S.C. 154(b) by 406 days.

(21) Appl. No.: 10/073,698

(22) Filed: Feb. 11, 2002

(65) Prior Publication Data

US 2002/0115417 A1 Aug. 22, 2002

(30) Foreign Application Priority Data

Feb. 21, 2001 (FI) .................................. 20010330

(51) Int. Cl.$^7$ ............................................. H04B 1/04
(52) U.S. Cl. ............................... 455/115.1; 455/114.2; 455/63.1
(58) Field of Search ......................... 455/115.1, 123, 455/125, 127.2, 91, 126, 114.2, 63.1, 67.13, 455/501; 330/2, 51; 375/195–296, 254

(56) References Cited

U.S. PATENT DOCUMENTS

| | | | | |
|---|---|---|---|---|
| 4,331,928 A | * | 5/1982 | Heidt | 330/149 |
| 4,870,374 A | * | 9/1989 | Harris | 332/145 |
| 5,507,017 A | * | 4/1996 | Whitmarsh et al. | 455/126 |
| 5,574,994 A | * | 11/1996 | Huang et al. | 455/126 |
| 5,613,226 A | * | 3/1997 | Kanami | 455/115.1 |
| 5,623,226 A | * | 4/1997 | Whitmarsh et al. | 330/2 |
| 5,628,059 A | * | 5/1997 | Kurisu | 455/126 |
| 5,793,817 A | * | 8/1998 | Wilson | 375/297 |
| 5,977,824 A | | 11/1999 | Sparks | 330/2 |
| 6,008,697 A | * | 12/1999 | Sparks | 330/279 |
| 6,266,517 B1 | * | 7/2001 | Fitzpatrick et al. | 455/114.3 |
| 6,381,286 B1 | * | 4/2002 | Wilkinson et al. | 375/296 |
| 2003/0073419 A1 | * | 4/2003 | Chadwick | 455/126 |

FOREIGN PATENT DOCUMENTS

| | | |
|---|---|---|
| EP | 063894 | 2/1995 |
| EP | 0648021 | 4/1995 |
| WO | WO 95/06354 | 3/1995 |
| WO | WO 00/57563 | 9/2000 |

OTHER PUBLICATIONS

Noise performance of a Cartesian loop transmitter Kenington, P.B.; Wilkinson, R.J.; Parsons, K.J.; Vehicular Technology, IEEE Transactions on , vol.: 46 , Issue: 2 , May 1997 pp.: 467-476.*

2 Amplifier linearization using RF feedback and feedforward techniques Faulkner, M.; Vehicular Technology, IEEE Transactions on, vol.: 47 , Issue: 1 , Feb. 1998 pp.: 209-215.*

* cited by examiner

Primary Examiner—Sonny Trinh
(74) Attorney, Agent, or Firm—Perman & Green, LLP.

(57) ABSTRACT

The invention relates to a method for reducing interference in radio transmitters with feedback from the antenna end to the baseband side and to a transmitter applying the said method. In a Cartesian loop formed for the linearization of a transmitter, the levels of baseband input signals ($s_{I2}$, $s_{Q2}$) to a modulator are measured and the attenuation of a level control unit (210) following the modulator (203) is adjusted until the modulator input signal levels are sufficiently above the noise level. The adjustment may be carried out as a one-time procedure during the manufacturing process or repeatedly during the operation of the device. By means of the invention, the noise level of the output signal of a linearized transmitter can be made lower than in known transmitters. Moreover, the transmitter may utilize a cheaper and, from the point of view of manufacturing, easier 4modulator than known transmitters.

10 Claims, 3 Drawing Sheets

METHOD FOR REDUCING INTERFERENCE IN TRANSMITTER AND TRANSMITTER

BACKGROUND OF THE INVENTION

The invention relates to a method for reducing interference in radio transmitters, which have feedback from the antenna end to the baseband side. The invention further relates to a transmitter applying the said method.

In all radio systems utilizing multiple carrier wave frequencies it is important that the signals in the different frequency division channels not interfere with each other. Non-interference requires that transmission power levels are kept low enough and the spectrum of the transmission signal is confined as accurately as possible to the frequency band allocated to it. Spreading of the spectrum is caused by the modulation required by radio transmission and in particular by nonlinearity in the transmitter units. The latter results in various extra spurious spectra which may be located in bands corresponding to the other frequency division channels. In practice, there is always some nonlinearity in mixers and amplifiers, in principle the more, the higher the level of the signal. So, in this respect the power amplifier in a transmitter may prove to be a problematic component.

Filters have been conventionally used to limit the spectrum of a signal. In practice, however, the linearity of the transmitter must also be taken into account, in addition to filtering. One way of improving the linearity is to arrange for feedback from the antenna feed point to the baseband side so that a change is made in the signal going to the modulator, which change is equal to the distortion but opposite to it. This type of correction is represented by the so-called Cartesian loop shown in FIG. 1. The figure shows a simplified block diagram of a transmitter comprising, connected in series, a modulator 103, a first level control unit 110, radio-frequency power amplifier 120, directional coupler 130, and an antenna 140. The modulator is of the quadrature type: it has got two branches, I (in-phase) and Q (quadrature phase), which both include an analog multiplier that shifts the signal spectrum into the radio-frequency range. Carrier waves of the same frequency are brought to the analog multipliers and a phase difference of 90 degrees, necessary for the operation of the modulator, is produced between the carrier waves in a block of its own. The carrier wave comes from a local oscillator 171. The signals output by the analog multipliers are summed up, producing the modulator output signal SM.

The level control units 110 and 150 may be variable attenuators or variable amplifiers. The attenuation or gain may be adjusted in a continuous or stepwise manner. In this description and in the claims we will only use the term attenuation as regards the level control unit. Attenuation may also be negative, which means (positive) gain.

The feedback branch of the Cartesian loop begins at the side port p1 of the said directional coupler 130, to which port a small fraction of the energy fed towards the antenna by the power amplifier 120 is transferred. The signal SFB from the port p1 is taken to the second level control unit 150 and from there to a quadrature demodulator 160. The carrier waves used by the demodulator are synchronized with the carrier waves of the modulator 103, so the demodulator produces signals shaped like the input signals of the modulator. In FIG. 1, the output signal of the upper or I' branch is marked $s_{I'}$ and the output signal of the lower or Q' branch is marked $s_{Q'}$.

For modulation, the data signal to be transmitted is divided into two signals $s_{I1}$ and $s_{Q1}$, which are the input signals of the structure shown in FIG. 1. They would be taken straight to the modulator were linearization not used. In FIG. 1, the difference of the I branch input signal $s_{I1}$ and the corresponding signal $s_{I'}$ generated by the demodulator is produced in a differential amplifier 101 the output signal $s_{I2}$ of which is then taken to the analog multiplier of the I branch of the modulator 103, to the baseband input thereof. Similarly, the difference of the Q branch input signal $s_{Q1}$ and the corresponding signal $s_{Q'}$ generated by the demodulator is produced in a differential amplifier 102 the output signal $s_{Q2}$ of which is then taken to the baseband input of the Q branch of the modulator 103. This closes the Cartesian loop. The feedback provides information on the distortion caused primarily by the power amplifier, and the loop attempts to minimize this distortion, i.e. linearize the transmission path. Linearization is based on the fact that when the loop gain is high enough and the feedback fast enough, signal $s_{I'}$ is forced into the shape of signal $s_{I1}$ and, correspondingly, signal $s_{Q'}$ is forced into the shape of signal $s_{Q1}$. Thus the signal fed to the antenna, from which signals $s_{I'}$ and $s_{Q'}$ have been developed, corresponds to the undistorted baseband signals and therefore has a purer spectrum than if no feedback were used. For the waveforms of signals $s_{I1}$ and $s_{I'}$, and, correspondingly, the waveforms of signals $s_{Q1}$ and $s_{Q'}$ to be coincident in time, the delay in the signal caused by the transmission path to the antenna must be accounted for. To this end, the carrier wave from the local oscillator 171 is taken to the demodulator direct, but to the modulator via a phase shifter 172. A value is determined for the phase difference $\Delta\phi$ produced by the phase shifter such that the above-mentioned delay is cancelled from the feedback point of view. The phase shifter could as well be located in the branch leading to the demodulator, in which case the phase difference $\Delta\phi$ should be opposite to the one depicted in FIG. 1.

FIG. 1 further shows a processor 180 to set the attenuations of the first and second level control units. This kind of a structure is known from patent publication EP 0 638 994. The idea therein, in addition to linearization, is to set the output level of the transmitter suitable while at the same time keeping the loop gain, which is important for the functioning of the loop, unchanged. This is realized by changing the transmitter output level, or the level of signal $s_P$, by driving the second level control unit 150. The said level depends directly on the setting of the second level control unit since the levels of signals $s_{I'}$ and $s_{Q'}$ are in practice constant. The first level control unit 110 is simultaneously driven in the opposite direction so that the combined attenuation of the level control units stays constant. The drawback of the structure is that the noise caused by the modulator 103 may reach a detrimental level. This results from the fact that component tolerances cause variation in the levels of the modulator input signals $s_{I2}$ and $s_{Q2}$ in individual devices. The input signal levels may be relatively near the noise level, whereby naturally the signal-to-noise ratio of the modulator output signal and the output signal of the whole transmitter is relatively poor.

SUMMARY OF THE INVENTION

An object of the invention is to reduce the said disadvantage associated with the prior art. The method according to the invention is characterized in that which is specified in the independent claim 1. The transmitter according to the invention is characterized in that which is specified in the independent claim 5. The other claims specify some preferred embodiments of the invention.

The basic idea of the invention is that in the Cartesian loop formed for the linearization of a transmitter, the level of baseband input signals to the modulator is measured and the attenuation of a level control unit following the modulator is adjusted until the modulator input signal levels are suitable. The adjustment may be realized as a one-time step in the manufacturing process or repeatedly during the operation of the device.

An advantage of the invention is that the noise level of the output signal of the linearized transmitter is on average lower than in prior-art transmitters. This is a result from the fact that in the transmitter according to the invention it is made certain that the levels of the modulator input signals stay above the noise level to a sufficient extent. Another advantage of the invention is that for the reason mentioned above it is possible to use a cheaper and, from the point of view of manufacturing, easier modulator than in transmitters according to the prior art. Moreover, a better signal-to-noise ratio of the modulator input signals means that transmitter linearization works better than in transmitters of the prior art, whereby the spectrum of the signal stays better within the channel allocated to it. A further advantage of the invention is that it can also be used to detect instability in the Cartesian loop if such instability exists. The instability can be seen as temporal variation in the modulator input signal levels.

BRIEF DESCRIPTION OF THE DRAWING

The invention is described more closely in the following. Reference is made to the accompanying drawings in which.

DETAILED DESCRIPTION OF THE INVENTION

Figure 1:
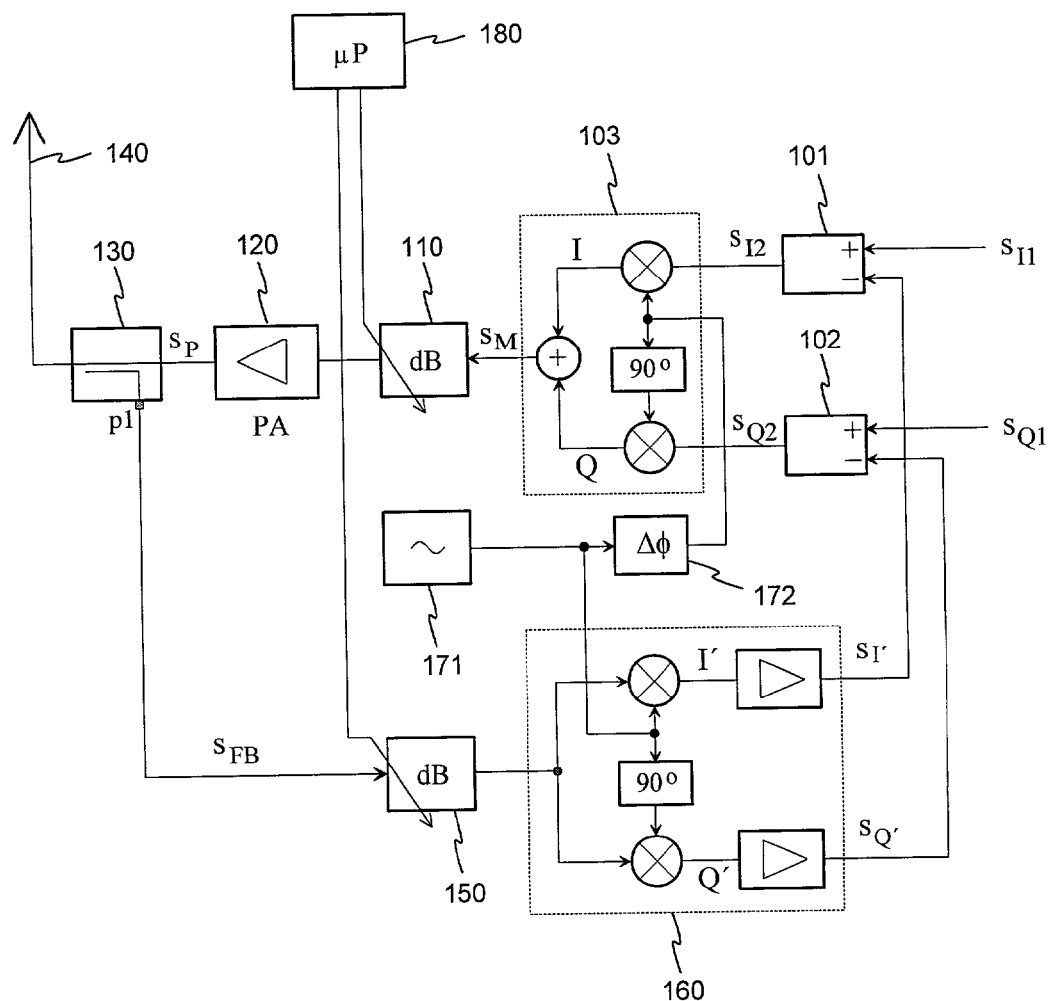
FIG. 1 shows an example of an arrangement according to the prior art for reducing transmitter interference.

FIG. 1 was already discussed in connection with the description of the prior art.

Figure 2:
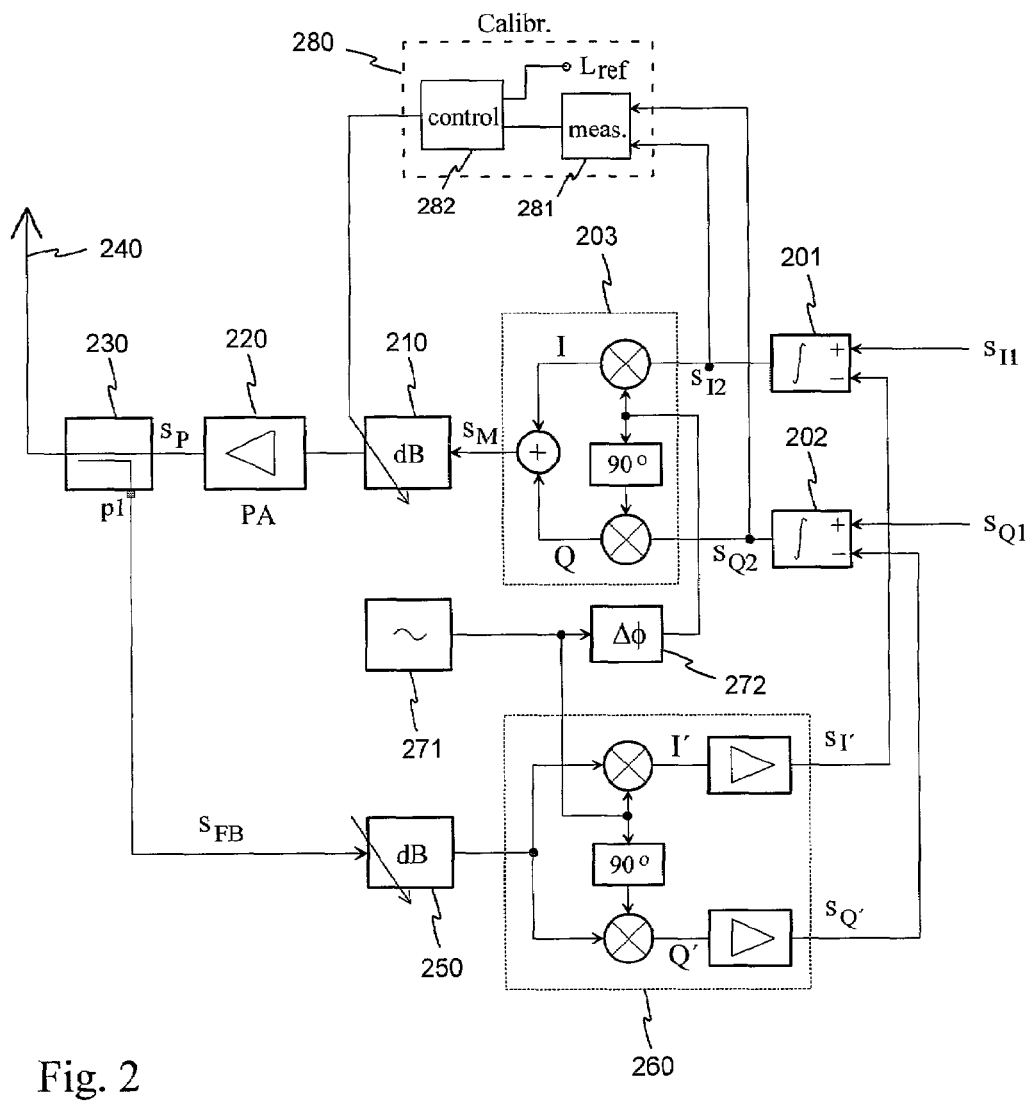
FIG. 2 shows an example of the arrangement according to the invention for reducing transmitter interference.

FIG. 2 shows a basic Cartesian loop like the one shown in FIG. 1. The differential amplifiers 201 and 202 in the transmitter input are shown to be integrators, which means that they amplify an integrated difference signal. Integration produces suitable slowness for the loop function in order to improve stability. A significant difference from the arrangement depicted in FIG. 1 is that the control information for the first level control unit 210 is taken from within the loop and not from outside the loop. In the arrangement according to FIG. 2, the levels of the output signals of the differential amplifiers 201, i.e. the input signals of the modulator 203, or at least one of them, is monitored by a measuring circuit 281 belonging to a calibrating unit 280. The output of the said measuring circuit is connected to a first input of a control circuit 282. At the second input of the control circuit 282 there is a constant reference level $L_{ref}$ for comparison. The output of the control unit, which is also the output of the calibrating unit 280 is connected to a control input of the first level control unit 210. If the signal level measured is below the reference level, the attenuation of the first level control unit is increased. The level of the transmitter output signal $s_P$ is thus at first dropped, whereby the levels of the output signals $s_{I'}$ and $s_{Q'}$ of the demodulator 260 drop, too. This further causes the levels of the output signals $s_{I2}$ and $s_{Q2}$ of the differential amplifiers to rise, as do the output levels of the units following them. The change goes on within the Cartesian loop until the levels of the signals $s_{I'}$ and $s_{Q'}$ have again reached the levels of the input signals $s_{I1}$ and $s_{Q1}$. So, the levels of the signals $s_{I2}$ and $s_{Q2}$ rise with the result that they end up being equal to the reference level $L_{ref}$. The reference level $L_{ref}$ is chosen such that it is sufficiently above the noise level in the modulator input. In accordance with the invention it is made certain, in the manner described above, that the signal-to-noise ratio cannot substantially decrease in the modulator which in this respect is a critical component.

Conversely, if the signal level measured is above the reference level, the attenuation of the first level control unit is decreased, and the procedure described above is repeated, with the exception that the sign of each level change is reversed. Operation according to the invention has in this case the advantage that the modulator and the units following it stay more accurately within the linear region.

Level variation in the modulator input signals $s_{I2}$ and $s_{Q2}$ is mainly a result of transmitter component tolerances. So the variation is device-specific, which means that in principle it suffices that the attenuation of the first level control unit is set suitable once during the manufacturing process of the device. In that case the calibrating unit 280 consists of equipment external to the radio apparatus. Alternatively, the calibrating unit may be arranged to be completely internal to the radio apparatus. In that case the measurement and adjustment of the modulator input signal levels can be arranged to be carried out repeatedly in a free time slot of the radio system in which the transmitter is operating. Also the transmission time slot can be used if the signal quality stays within allowable limits during the adjustment. The manner of implementation of the calibrating unit may vary greatly. The operating blocks 281 and 282 shown in FIG. 2 may be analog or part analog, part digital. They may also be realized processor-based, whereby the measured signals $s_{I2}$ and $s_{Q2}$ are first converted digital and then processed in the processor.

Figure 3:
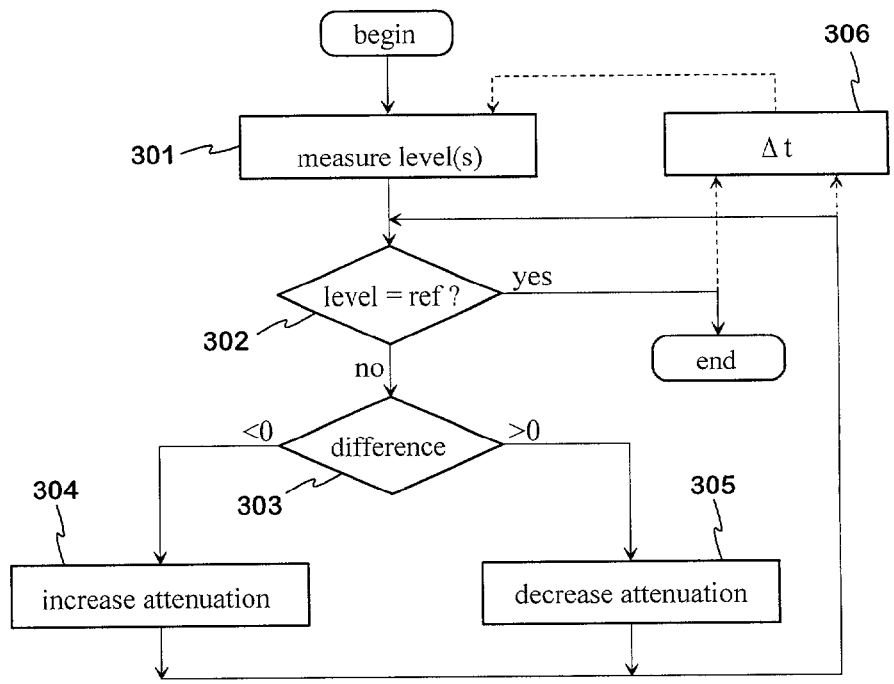
FIG. 3 shows in the form of flow diagram the method according to the invention.

FIG. 3 illustrates the method according to the invention in a flow diagram. In step 301 the level of at least one of the modulator's input signals is measured. In step 302 it is checked whether the level measured equals the reference level. If not, it is checked to which direction it deviates therefrom (step 303). If the level measured is too low, the attenuation of the first level control unit is increased in accordance with step 304. Conversely, if the level measured is too high, the attenuation of the first level control unit is decreased in accordance with step 305. After both step 304 and step 305 the process returns to step 302. The operation goes on in this manner until the level measured equals the reference level with sufficient accuracy. If calibration is realized using a calibrating unit internal to the radio apparatus, the level measurement according to step 301 is carried out repeatedly. When the attenuation of the level control unit has been changed, the process returns after a certain time $\Delta t$ to step 301 in a suitable time slot (step 306). The process also returns there if the level measured equals the reference level with sufficient accuracy. That part of the diagram only regarding the internal calibrating is shown with dashed lines in FIG. 3.

Figure 4:
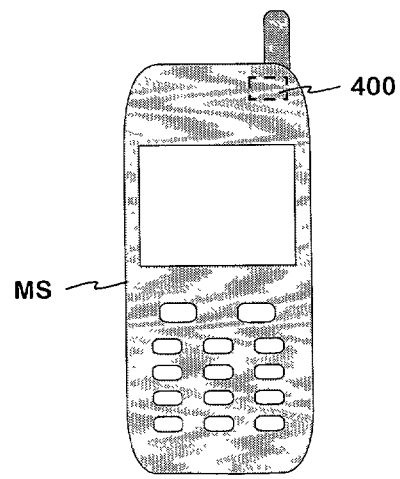
FIG. 4 shows an example of a radio apparatus applying the invention.

FIG. 4 shows an example of a radio apparatus MS (Mobile Station) comprising a transmitter 400 according to the invention. The radio apparatus MS may be in accordance with the TETRA (Terrestrial Trunked Radio) system, for instance. The radio apparatus need not be a portable one, as in FIG. 4, but it may be part of a base station, for example.

Above it was described the principle and a manner of implementation of the invention. The invention is not limited to the structures and implementations described above. It can be applied in different ways in different systems within the scope defined by the independent claims.

What is claimed is:

1. A method to reduce interference in a radio transmitter which comprises, listed in the direction of propagation of signal, at least one differential amplifier, a modulator, first level control unit, a power amplifier, a directional coupler and an antenna as well as a feedback path from the directional coupler to said differential amplifiers, which feedback path comprises a second level control unit and a demodulator to linearize the radio transmitter, the method comprising:

measuring the level of at least one input signal of the modulator, comparing the level measured to a certain reference level, increasing the attenuation of the first level control unit if the level measured is lower than the reference level, and decreasing the attenuation of the first level control unit if the level measured is higher than the reference level.

2. The method according to claim 1, measures to set the attenuation of the first level control unit being carried out in conjunction with manufacture of the radio transmitter.

3. The method according to claim 1, where the radio transmitter functions according to a system based on time division, technology, measures to set the attenuation of the first level control unit being carried out repeatedly in a free time slot of said system when the radio transmitter is in operation.

4. The method according to claim 1, where the radio transmitter functions according to a system based on time division technology, measures to set the attenuation of the first level control unit being carried out repeatedly in a transmission time slot of said system when the radio transmitter is in operation.

5. The method according to claim 1, wherein the modulator operates to combine in-phase and quadrature components of an input signal applied to the modulator respectively by a first and a second of the differential amplifiers, wherein the demodulator operates to separate in-phase and quadrature components of a feedback signal of the feedback path, wherein the first differential amplifier obtains a difference between the in-phase components of the input signal and the feedback signal, and the second differential amplifier obtains a difference between the quadrature components of the input signal and the feedback signal for operation of the radio transmitter as a Cartesian loop; and wherein, in said measuring step, signal level is measured at the outputs of the first and the second differential amplifiers.

6. A radio transmitter comprising, listed in the direction of propagation of signal, at least one differential amplifier to produce a difference of a baseband input signal and a feedback signal, a modulator, a first level control unit, a power amplifier, a directional coupler and an antenna as well as a feedback path from the directional coupler to said differential amplifiers, which feedback path comprises a second level control unit and a demodulator to linearize the radio transmitter, the radio transmitter further comprising a means to measure the level of at least one input signal of the modulator and to compare that level to a certain reference level and to set the attenuation of the first level control unit on the basis of a result of the comparison.

7. The radio transmitter according to claim 6, said means to measure the level of at least one input signal of the modulator comprising an analog-to-digital converter and said means to compare the level of at least one input signal of the modulator and to set the attenuation of the first level control unit comprising a processor.

8. The radio transmitter according to claim 6, said means to measure the level of at least one input signal of the modulator and to compare the level to a certain reference level, and to set the attenuation of the first level control unit, comprising an analog comparator and amplifier.

9. A radio apparatus comprising a transmitter according to claim 6.

10. The radio transmitter according to claim 6, wherein the modulator operates to combine inphase and quadrature components of the input signal applied to the modulator respectively by a first and a second of the differential amplifiers, wherein the demodulator operates to separate in-phase and quadrature components of a feedback signal of the feedback path, wherein the first differential amplifier obtains a difference between the inphase components of the input signal and the feedback signal, and the second differential amplifier obtains a difference between the quadrature components of the input signal and the feedback signal for operation of the radio transmitter as a Cartesian loop; and wherein, in said measuring means, signal level is measured at the outputs of the first and the second differential amplifiers.

* * * * *